United States Patent [19]
Rivas

[11] Patent Number: 5,904,980
[45] Date of Patent: May 18, 1999

[54] ELECTROMAGNETIC INTERFERENCE (EMI) SHIELDING AND ELECTROSTATIC DISCHARGE DEGRADABLE POLYMERS AND MONOMERS

[76] Inventor: Victor A. Rivas, P.O. Box 30711, Lincoln, Nebr. 68503

[21] Appl. No.: 08/854,984

[22] Filed: May 13, 1997

Related U.S. Application Data

[60] Provisional application No. 60/017,328, May 13, 1996.
[51] Int. Cl.$^6$ ............... B32B 9/00; C08K 3/08; G21F 1/10; G21K 1/10
[52] U.S. Cl. ............ 428/362; 428/367; 428/369; 428/408; 524/439; 524/440; 524/441; 523/137
[58] Field of Search ................... 428/362, 367, 428/369, 408; 524/439, 440, 441; 523/137

[56] References Cited

U.S. PATENT DOCUMENTS

| | | | |
|---|---|---|---|
| 5,177,660 | 1/1993 | Kilner | 361/220 |
| 5,582,912 | 12/1996 | McCullough, Jr. et al. | 428/367 |

*Primary Examiner*—Nathan M. Nutter
*Attorney, Agent, or Firm*—James Creighton Wray; Meera P. Narasimhan

[57] ABSTRACT

Lightweight and strong electromagnetic interference (EMI) shielding and electrostatic discharge (ESD) reinforced degradable polymer and monomer material and plastic enclosure materials are provided for electronic devices and EMI shielded rooms. A degradable polymer or monomer (polylactic acid, starch and polycaprolactone, cellulose esters, zein, modified lesquerell and soybean oils, and glucaric acid) contain an EMIS/ESD additive of iron coated fibers, iron-carbone (Martensites), iron-nickel coated carbon fibers, stainless-steel fibers, aluminum fibers, conductive flakes, and conductive powders. Intrinsic conductive polymers such as polyparaphenylene, polyacetylene, polyanaline, polyquinoline and polythiophene are also used. By combining the degradable polymer/monomer and one or more of the additives, the enclosures meet the U.S. government requirements for electromagnetic interference (EMI) shielding and electrostatic discharge (ESD) on both consumer electronics and military application. The combining of the polymers/monomers with the additives increases the strength of the materials and thermal conductivity.

23 Claims, 6 Drawing Sheets

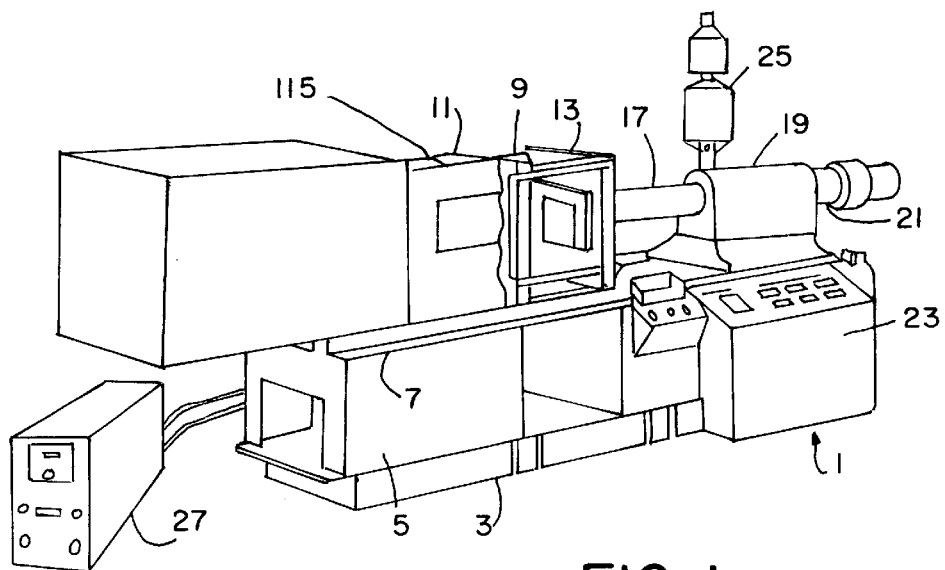
FIG. 1
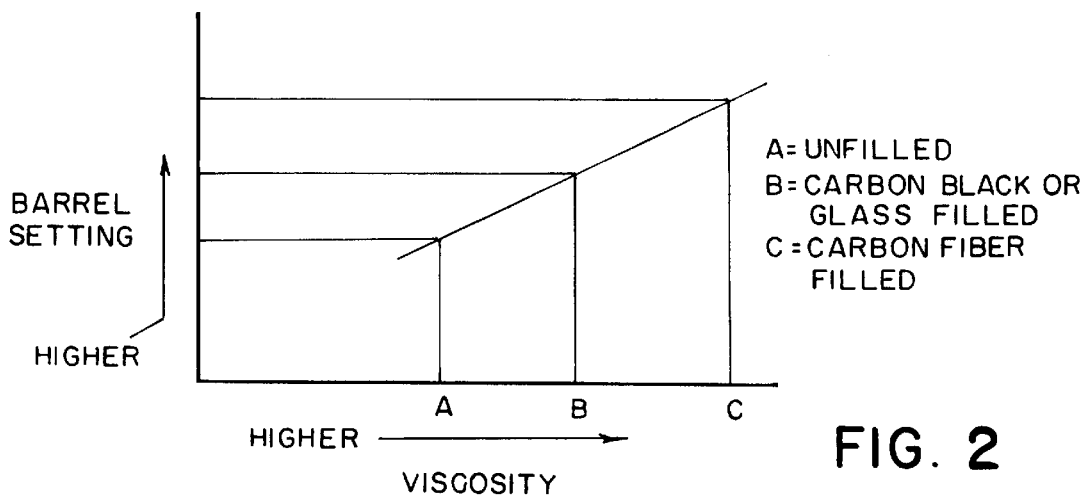
A = UNFILLED
B = CARBON BLACK OR GLASS FILLED
C = CARBON FIBER FILLED
FIG. 2
FIG. 3
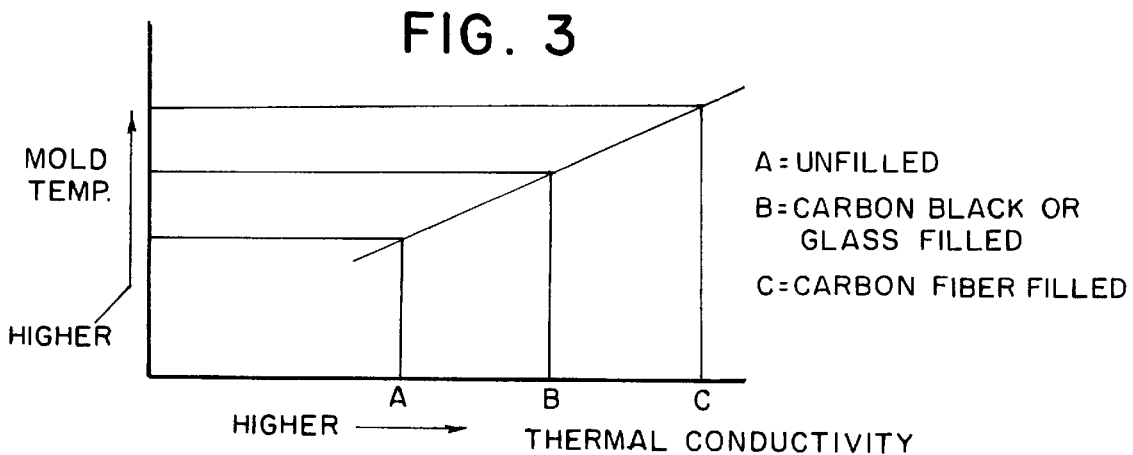
A = UNFILLED
B = CARBON BLACK OR GLASS FILLED
C = CARBON FIBER FILLED

| METHOD | ADVANTAGE | DISADVANTAGE |
|---|---|---|
| ALUMINUM FLAKES | GOOD CONDUCTIVITY, INEXPENSIVE. | HIGH WEIGHT PERCENTAGE, UP TO 40%. |
| SILVER-COATED MICROSHARES | EXCELLENT CONDUCTIVITY. | HIGH WEIGHT PERCENTAGE, UP TO 40%. |
| STAINLESS STEEL | GOOD CONDUCTIVITY, STRONG. GOOD HEAT TRANSFER. | ABRASIVE TO INJECTION MOLDING EQUIPMENT. CURLING PREVENTS FLOW INTO COMPLEX SHAPES. |
| NICKEL-COATED FIBERS | GOOD CONDUCTIVITY, STRONG. GOOD HEAT TRANSFER. | ENVIRONMENTALLY UNFRIENDLY, IMPORTED. REQUIRES SURFACE GRINDING OF METAL INSERTS FOR ELECTRICAL CONDUCTIVITY. |
| IRON-COATED FIBERS (VAR tex™) | GOOD CONDUCTIVITY, STRONG. GOOD HEAT TRANSFER. ENVIRONMENTALLY FRIENDLY. | REQUIRES SURFACE GRINDING OF METAL INSERTS FOR ELECTRICAL CONDUCTIVITY |
| SILVER PAINT | EXCELLENT CONDUCTIVITY. | EXPENSIVE. SENSITIVE TO SCRATCHES. |
| COPPER PAINT | GOOD CONDUCTIVITY. | OXIDIZES AND LOSES PROPERTIES IF NOT PROTECTED. SENSITIVE TO SCRATCHES. |
| NICKEL PAINT | GOOD CONDUCTIVITY. | REQUIRE MULTIPLE COATS. EXPENSIVE. SENSITIVE TO SCRATCHES. |

FIG. 5-1

| | | |
|---|---|---|
| ZINC ARC SPRAY | EXCELLENT CONDUCTIVITY. | SKILLED LABOR REQUIRED. SPECIAL EQUIPMENT REQUIRED. MAY DISTORT THE PLASTIC SUBSTRATE. EXPENSIVE |
| CATHODE SPUTTERING | GOOD CONDUCTIVITY. | SKILLED LABOR AND SPECIAL EQUIPMENT REQUIRED. EXPENSIVE. |
| VACUUM METALIZATION | GOOD CONDUCTIVITY. GOOD ADHESION. APPLICABLE TO COMPLEX SHAPED PLASTICS. | COAT THIN. REQUIRES EXPENSIVE EQUIPMENT AND SURFACE TREATMENT PRIOR TO METALIZING. |
| ELECTROLESS PLATING | GOOD CONDUCTIVITY, UNIFORM THICKNESS. APPLICABLE TO COMPLEX SHAPED PLASTICS. FLAKE RESISTANT. PLATES BOTH SIDES. | REQUIRES FINISH ON OUTER SURFACE OF ENCLOSURES. EXPENSIVE. |
| FOIL APPLICATIONS | GOOD CONDUCTIVITY. USEFUL IN DEVELOPMENT AND EXPERIMENTAL WORK. | LABOR INTENSIVE. UNSUITABLE FOR COMPLEX PARTS. EXPENSIVE. |
| I.C.P. (INTRINSICALLY CONDUCTIVE POLYMERS) | GOOD CONDUCTIVITY. | I.C.P. STILL IN R & D STAGE. EXPENSIVE. |

FIG. 5-2

ELECTROMAGNETIC INTERFERENCE (EMI) SHIELDING AND ELECTROSTATIC DISCHARGE DEGRADABLE POLYMERS AND MONOMERS

BACKGROUND OF THE INVENTION

This application claims the benefit of U.S. Provisional Application No. 60/017,328 filed May 13, 1996.

SUMMARY OF THE INVENTION

The material created uses a degradable polymer, monomer, homopolymer or copolymer (polylactic acid, starch and polycaprolactone, cellulose esters, zein, modified lesquerell and soybean oils, and glucaric acid) and an electromagnetic interference (EMI) shielding and electrostatic discharge (ESD) protection additives that include iron coated carbon or rayon fibers, Martensites, iron-nickel coated carbon fibers, stainless-steel fibers, aluminum fibers, conductive flakes, and conductive fibers. The invention also includes intrinsic conductive polymers that include but are not limited to polyparaphenylene, polyacetylene, polyanaline, polyquinoline and polythiophene. Combining the degradable polymer/monomer and one or more of the additives listed above meets the U.S. government requirements for electromagnetic interference (EMI) shielding and electrostatic discharge (ESD) regulations on both consumer electronics and military applications. The combining of the polymers/monomers with these additives increases the strength of the resultant material and its thermal conductivity.

The invention also includes the combining of the polymer/monomer with conductive polymers prepared by pyrolysis, ziegler-natta catalysis, electrochemical synthesis, and condensation polymerization. This invention also includes the metallization of a finished degradable plastic enclosure using silver paint, copper paint, nickel paint, zinc arc spraying, cathode sputtering, vacuum metallization, electroless plating, foil application and conductive films.

The preferred material is created during the extrusion process of the degradable polymer/monomer and shielding additive in a ratio of approximately 95% to 85% polymer/monomer and 5% to 15% EMIS/ESD additive, subject to the application and specific polymer or monomer used. The material may be extruded or co-extruded in injection molding or in sheet extrusion, thermo-formed, compression molded, roto-molded, centrifugally molded and formed in other processes equipment typically used in plastics manufacturing for the creation and fabrication of products from plastic or plastic-like material.

The resulting material provides adequate shielding effectiveness for unwanted radiations generated in electronic devices and frequencies controlled by the Federal Communications Commission and the U.S. Department of Defense. Additionally, the material is insolvent in water and unaffected by moisture. However, when in a composting environment the material will degrade in approximately four weeks.

Among the several areas of use are consumer electronics, telecommunication, automotive electronics, medical devices, avionics, industrial electronics and architectural shielded rooms.

These and further and other objects and features of the invention are apparent in the disclosure, which includes the above and ongoing written specification, with the claims and the drawings.

BRIEF DESCRIPTION OF THE DRAWINGS

FIG. 1 shows a typical molding equipment for the degradable EMI and ESD plastics of the invention.

FIG. 2 is a graph showing barrel temperature vs. viscosity.

FIG. 3 is a graph showing mold temperature vs. thermal conductivity.

FIG. 5 is a chart showing competing methods for EMI shielding of plastic enclosures.

DETAILED DESCRIPTION OF THE PREFERRED EMBODIMENTS

Figure 6:
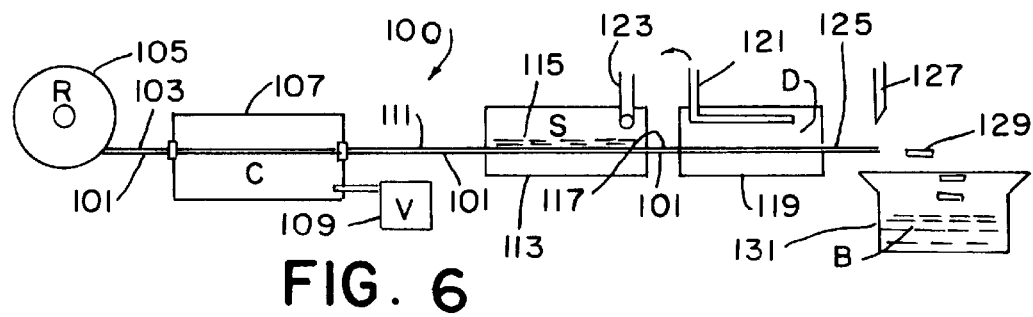
FIG. 6 is a schematic representation of a fiber pellet forming operation.

A typical molding equipment for degradable EMI and ESD plastics is generally indicated by the numeral 1. The molding machine has a base 3 with a support 5 and a table 7 on which the molding equipment is mounted. Mold 9 is positioned between two clamps 11 and 13 and is opened and closed by clamping equipment 15. The mold is filled with material from a heated barrel 17, which is maintained above the melting temperature of the heated plastic. The shot size is controlled in the barrel 17. A screw housing 19 supports a screw 21. The housing supports the back pressure. The rotational speed of the screw 21, controls the injection speed and injection pressure of the molten plastic material flowing from the barrel 17 to the mold 9. Control 23 controls the barrel temperature, the back pressure, the screw rpm, the injection speed and the injection pressure. A dryer 23 removes moisture and gas from the material as it is heated in the barrel for injecting. A control 27 controls the mold temperature in which the degradable plastic with the conductive additive hardens before release. Control 23 opens and closes the mold.

As shown in FIG. 2, the viscosity of the plastic material within the barrel increases with loading or filling of the plastic material with additives. When the plastic is unfilled, as shown at the line A, the viscosity allows the barrel temperature setting to be lower. When the plastic material is filled with carbon black or glass as shown at point B, the barrel temperature setting must be higher. When the plastic is filled with carbon fiber, as indicated at point C, the barrel temperature setting must be still higher because the viscosity is higher.

As shown in FIG. 3, the thermal conductivity increases as the plastic is filled with additives. Consequently the initial mold temperature is higher for the filled plastic. As shown at point A, the unfilled plastic has a low thermal conductivity and the mold temperature initially may be lower. When the plastic is filled with carbon black or glass, as shown at B in FIG. 3, the thermal conductivity increases and the initial mold temperature must be higher. When filled with metal coated carbon fiber the thermal conductivity increases, as shown at point C, and the mold temperature must be still higher. While the thermal conductivity increases and requires higher mold temperatures for fiber filled plastics, the thermal conductivity has advantages in the molding process in that it allows rapid uniform cooling without introducing stress. The parts may be taken out of the mold sooner than with low conductivity material. The degradable materials of the present invention need the higher barrel temperatures and mold temperatures required for the fiber filled material. In addition the fibers, preferably coated with metal, provide excellent thermal conductivity to ensure uniform heating and uniform and more rapid cooling.

Figure 4:
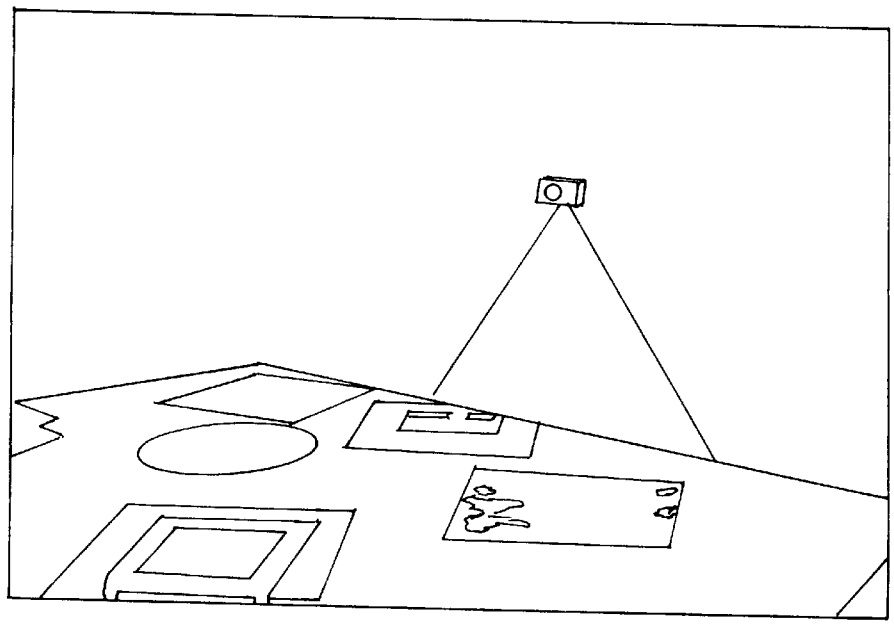
FIG. 4 is a photograph of an anachoic chamber for an EMI shielding test.

FIG. 4 shows an anachoic chamber in which the EMI shielding materials are tested.

FIG. 5 is a chart of additional methods for EMI shielding of plastic enclosures. Aluminum flakes and silver coated microspheres provide good and excellent conductivity but require high weight percentages. Stainless steel fibers provide good conductivity and strength and good heat transfer but are difficult to use, especially where shapes are complex. Nickel coated fibers provide good strength conductivity and heat transfer, but have disadvantages which recommend against their use. Iron coated fibers provide good conductivity and heat transfer. In nickel and iron coated fibers some surface grinding of the metal is required.

Silver paint, copper paint and nickel paint are acceptable but have disadvantages. Zinc arc spray provides excellent conductivity but requires skilled labor and is expensive. Cathode sputtering requires skilled labor and special equipment, and is expensive.

Vacuum metallization requires expensive equipment and electroless plating is expensive. Foil coatings provide good conductivity, but are labor intensive and expensive. Intrinsically conductive polymers provide good conductivity but are still in the R & D stages and are expensive.

The invention provides a degradable electromagnetic interference shielding and electrostatic discharge material for electronic device housings, comprising about 95% to 85% degradable plastic. About 5% to 15% conductive particle additive is mixed intimately with the degradable plastic for increasing strength, thermal conductivity, electromagnetic interference shielding and electrostatic discharge capabilities of the material.

The preferred degradable plastic is a degradable polymer. The degradable plastic may be a degradable monomer. Preferably the degradable plastic is selected from a group consisting of polylactic acid, starch and polycaprolactone, cellulose esters, zein, modified lesquerell and soybean oils, and glucaric acid. In preferred embodiments, the electromagnetic interference shielding and the electrostatic discharge additive comprises iron coated fibers. In one preferred embodiment, the electromagnetic interference shielding and electrostatic discharge additive comprises iron coated fibers.

The preferred electromagnetic interference shielding and electrostatic discharge additive is selected from a group consisting of iron-nickel coated carbon fibers, iron coated carbon fibers, iron-carbide, stainless steel fibers and aluminum fibers.

One preferred electromagnetic interference shielding and electrostatic discharge protective part is an intrinsic conductive polymer selected from a group of conductive polymers consisting of polyparaphenylene, polyacetylene, polyanaline, polyquinoline and polythiophene and other conductive polymers.

The method of making an electronic enclosure, comprises providing degradable plastic pellets, providing metal coated fibers, intimately mixing degradable plastic pellets and the metal coated fibers, and putting the degradable plastic pellets under heat and pressure with the metal coated fibers intimately mixed therein, forming the degradable plastics and metal coated fibers into electronic device enclosures, thereby adding the enclosure with electromagnetic interference shielding, electrostatic discharge protection and increased strength of the material.

Lightweight and strong electromagnetic interference (EMI) shielding and electrostatic discharge (ESD) reinforced degradable polymer and monomer material and plastic enclosure materials are provided for electronic devices and EMI shielded rooms. A degradable polymer or monomer (polylactic acid, starch and polycaprolactone, cellulose esters, zein, modified lesquerell and soybean oils, and glucaric acid) contain an EMIS/ESD additive of iron coated fibers, iron-carbon (Martensites), iron-nickel coated carbon fibers, stainless-steel fibers, aluminum fibers, conductive flakes, and conductive powders. Intrinsic conductive polymers such as polyparaphenylene, polyacetylene, polyanaline, polyquinoline and polythiophene are also used. By combining the degradable polymer/monomer and one or more of the additives, the enclosures meet the U.S. government requirements for electromagnetic interference (EMI) shielding and electrostatic discharge (ESD) on both consumer electronics and military application. The combining of the polymers/monomers with the additives increases the strength of the materials and thermal conductivity.

EXAMPLE 1

Creating of Initial Material

The initial creation of forty five kilograms of EMI bioplastic was made using 5% VARtex and 95% EcoPLA$_{TM}$ (a polylactic acid polymer). The material was molded into 32 centimeter squares, with a thickness of 3 to 5 millimeters. During subsequent testing the optimum, cost-effective ratio for the material was determined to be approximated 10% VARtex and 90% EcoPLA$_{TM}$. VARtex is iron coated carbon fibers.

EXAMPLE 2

Injection Molding

Initial injection molding process information: Using the initial EMI bioplastic (10% VARtex and 90% EcoPLA$_{TM}$) the resin was dried four hours at 50° C. to a dew point of −34° C. The screw was a general purpose screw with L/D of 16:1 with a compression ratio of 2.5:1. Additional tests were also completed using a screw with L/D of 20:1 with a compression ration of 3:1 to identify any changes in resulting bioplastics characteristics. The following processing parameters were noted during these tests:

| Processing Information | |
| --- | --- |
| Melt Temperature | 170–193° C. |
| Feed Throat | 15–27° C. |
| Feed Temperature | 138–199° C. |
| Compression Section | 170–193° C. |
| Metering Section | 170–193° C. |
| Nozzle | 175–199° C. |
| Mold | 21–27° C. |
| Screw Speed | 100–175 RPM |
| Back Pressure | 50–150 psi |
| Mold Shrink Allowed | .003–.005 in/in |

EXAMPLE 3

Sheet Extrusion

Initial sheet extrusion process information: Using the initial EMI bioplastic (10% VARtex and 90% EcoPLA$_{TM}$), the resin was dried four hours at 50° C. to a dew point of −34° C. The resin was dried four hours at 50° C. to a dew point of −34° C. This test included using both a nitrogen blank in the feeding hopper to keep the resin dry during the extrusion process and without the nitrogen blank. Screw type was a general purpose screw with L/D of 24:1, both with and without screw cooling for the feed section. Additional tests were also completed using a screw with an L/D of 30:1, both with and without screw cooling for the feed section.

| Processing Information | |
|---|---|
| Melt Temperature | 160–185° C. |
| Feed Throat | 15–30° C. |
| Feed Temperature | 135–165° C. |
| Compression Section | 160–195° C. |
| Metering Section | 160–195° C. |
| Adapter | 160–180° C. |
| Die | 150–165 |
| Screw Speed | 20–165 RPM |

RESULTS OF EXAMPLES 2 AND 3

The samples from both the injection molding and sheet extrusion were divided into four equal parts. Samples that meet the volume resistivity test were sent for further testing.

The portion of the samples retained were tested for their properties; electrical (ASTM D-257 and others) and mechanical (ASTM D-256); ASTM D-638 and ASTM D-790 physical (various) and thermal properties (ASTM D-648 and UL-94). The EMI shielding effectiveness was at or above 35 decibels on all sample tests for frequency ranges between 30 MHZ and 1.0 GHZ.

The testing techniques employed use an expanded coaxial test fixture designed to expose the material under test (MUT) to a free space plane wave. Shielding effectiveness (SE) is determined by assessing the ratio of the power coupled through the test fixture with no MUT present, and then with the MUT introduced. The resulting SE values represent a quantitative measure of the EMI shielding capability of the MUT. A minimum SE value of 35 decibels for frequencies between 30 MHZ and 1 GHZ was obtained.

Replication and Duplication Using Other Materials

Using the formal in Examples 1, 2 and 3, other materials were substituted for EcoPLA$_{TM}$. These included Novamont S.p.A.'s Mater-Bi resins (which are a mixture of starch with cellulose derivatives and plasticizers from natural sources), Monsanto's Bipol resins, and Showa's Bionella resin. (These commercial resins suggest that materials made from starch and polycaprolactone, cellulose esters, zein, modified lesquerell and soybean oils, and glucaric acid can also be used to create an EMI or ESD degradable material.) The operating parameters were similar to those experienced using EcoPLA$_{TM}$. The method of mixing VARtex was the same in all tests. (Both gravimetric and ribbon mixing was used with no significant difference in the final material.) The same shielding capabilities when EcoPLA$_{TM}$ was used was noted using the other degradable materials.

Again, using the format in Examples, 1, 2 and 3, other EMI/EDS materials were substituted for VARtex. These included iron-carbide (Martensites), iron coated rayon fibers, iron-nickel coated carbon fibers, stainless steel fibers, aluminum fibers, copper fibers and conductive flakes and conductive powders from steel, aluminum and copper. Tests with intrinsic conductive polymers were also made that included polyparaphenylene, polyacetylene, polyanaline, polyquinoline and polythiophene. Although the mixing methods varied and the concentration required to replace VARtex ranged from 10% to 40%, the formations were able to meet EMI shielding effectiveness at or above 35 decibels for frequency ranges between 30 MHZ and 1.0 GHZ.

EMI Bioplastic Degradation Testing

The efficiency of the degradation characteristics of VARtex and EcoPLA$_{TM}$ molded materials were evaluated using laboratory scale bio-reactors.

The bio-reactor is an acrylic composting vessel. Aluminum bulkheads cover the top and bottom ends of the cylinder. An air discharge port is in the top, and an entrance port is near the bottom of the cylinder wall. Perforated distribution plates placed near the bottom of the cylinder and above the entrance port serve as the sample holder. Humid air was pumped into the vessel, passing through the perforations in the plate. A flow meter maintained the desired flow rates.

The EMI bioplastic was placed into biologically active simulated solid waste in the test vessels. Sterilized and unsterilized samples were tested to detect degradation. During the period of assessing the degradability of the samples, internal temperature, moisture content, total dry weight, pH of the mix, weight loss and production of carbon dioxide, ammonia, methane and oxygen were monitored by periodic sampling of the chamber.

At the end of six weeks, the initial samples of 10% VARtex and 90% EcoPLA$_{TM}$ had combined into the compost soil to the extent that the 10% VARtex could only be found using a microscope at 50 power and the 90% EcoPLA$_{TM}$ could not be found. That is consistent with the biodegradable feature of polylactic acid-based polymers. No further tests for degradation were conducted using the other degradable polymers as it was believed that similar results would be achieved.

EcoPLA$_{TM}$ is an example of a suitable degradable plastic made by Cargill Corporation from corn and is believed to be a polylactic acid polymer.

VARtex is a proprietary additive made by unreeling carbon fibers in a tow having about 12,000 fibers, vapor coating the fibers in a chamber with iron pentacarbonyl, sizing the coated fibers in a bath of 3% by weight polyvinyl alcohol, and drying and chopping the sized material into pellets about ¼" by ¹⁄₁₆". When the pellets are combined with the base plastic, usually in pellet form, and mixed and melted, a uniform dispersion of the short (¼") iron coated fibers results. The fibers may be about 3 microns in diameter and the metal coating about 0.5 microns thick.

Pellets containing chopped fibers are formed in a system generally indicated by the numeral 100 in FIG. 6. Tows 101 containing multiple fibers 103, for example 12,000 carbon fibers, are unspooled or unreeled from reel R 105. The tows are drawn through a metal coating C chamber 107 in which metal vapor V from a source 109 flows to metallize the fibers. The coated fibers 111 in tow 101 are then drawn through a sizing chamber 113, in which sizing S in a bath 115 coats the tow to produce a sized tow 117. The sized tow 117 is drawn through a dryer D chamber 119, and sizing vapors are returned through a reduced pressure vent 121 to the sizing supply 123. The dried sized tow 125 is then chopped with a blade 127 into pellets 129, which are about ¼"×¹⁄₁₆". Each pellet contains, for example, about 12,000 metal coated fibers of ¼" length. The pellets are stored in a bin B 131, from whence they are taken to be mixed with base degradable plastic pellets. Melting of the base pellets dissolves the sizing and releases and disperses the individual metal coated fibers throughout the melted plastic.

Figure 7:
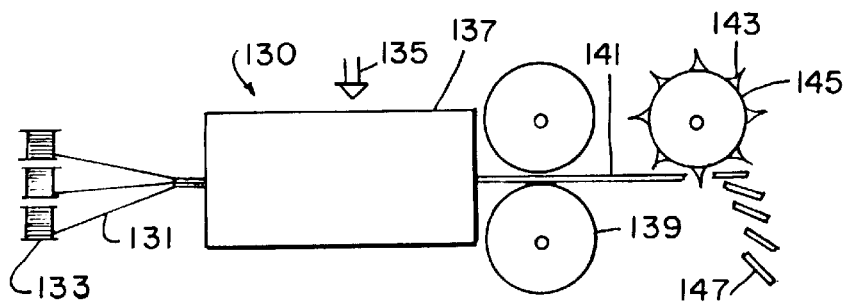
FIG. 7 is a schematic representation of a preferred fiber pellet forming operation.

FIG. 7 shows a preferred coating system 130. Metal coated fiber rovings 313 are unreeled from spools 133. Resin 135 is added in impregnation head and processing die 137. Puller rollers 139 pull the resin impregnated two 141, and blades 143 of chopper 145 chop the resin impregnated tow into pellets 147, about 11 mm long and 3 mm in diameter.

Figure 8:
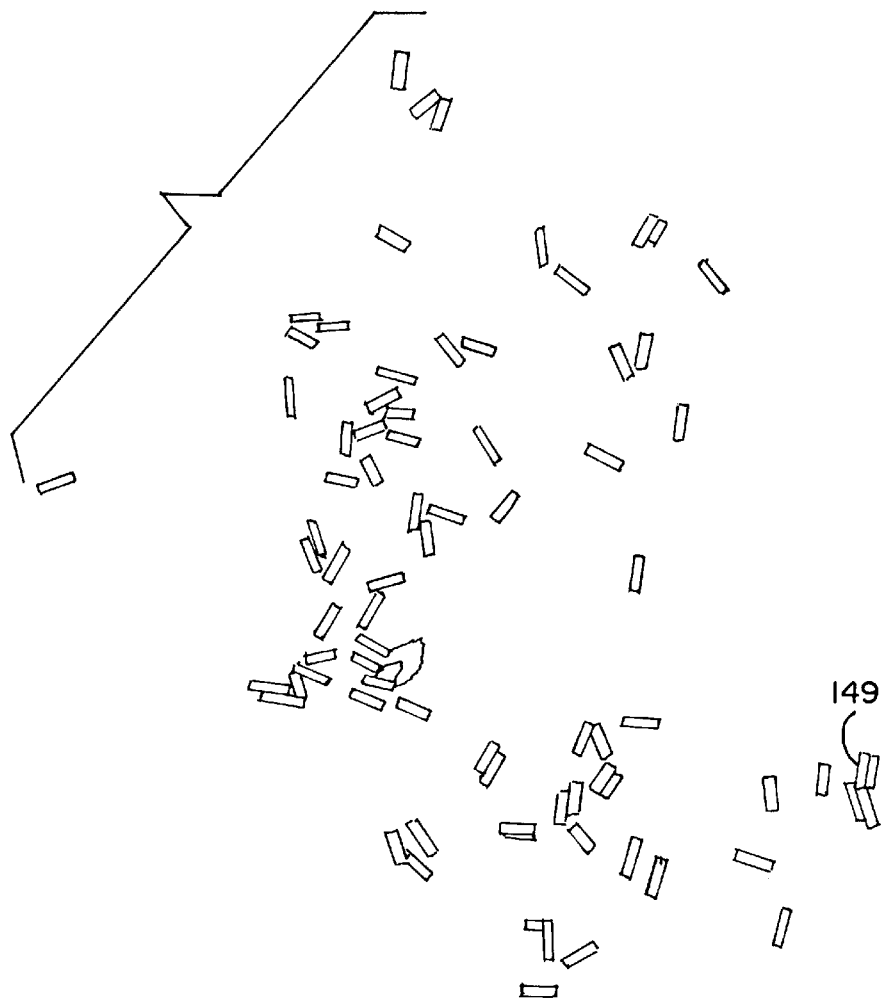
FIG. 8 shows metal coated fiber pellets.

FIG. 8 shows metal coated carbon fibers 149 in pellets 147.

Figure 9:
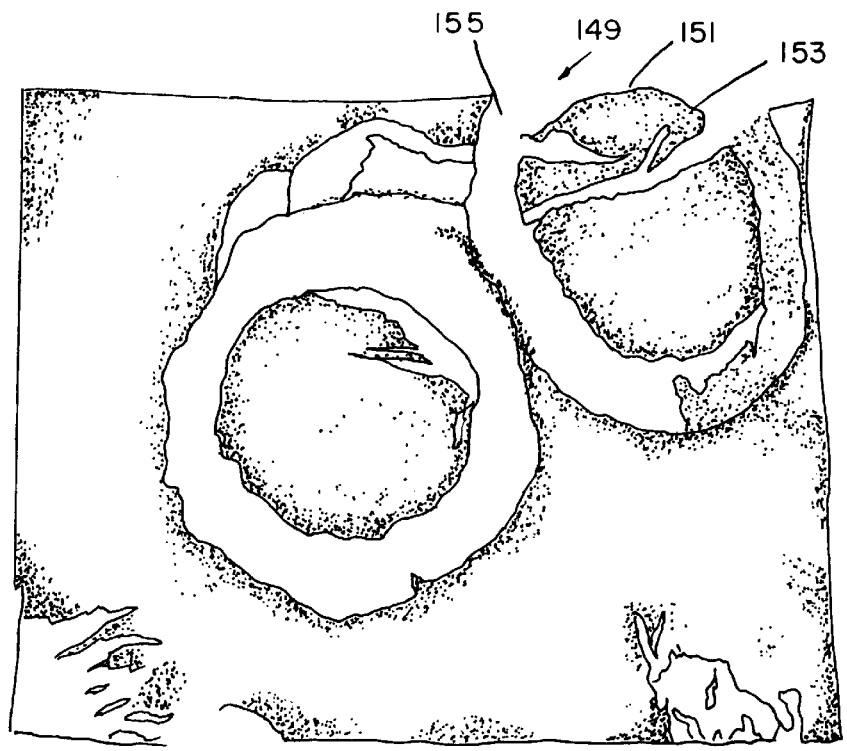
FIG. 9 is a photomicrograph of coated fiber ends.

FIG. 9 is a photomicrograph of the chopped fiber 149 ends 151 showing the carbon fiber 153 about 7 microns in diameter, and the metal coating 155 about 1 micron in thickness.

Figure 10:
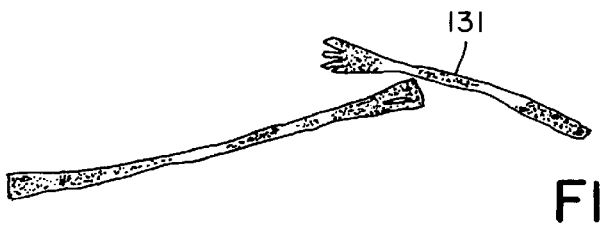
FIG. 10 shows fiber rovings or tows.

FIG. 10 shows metal coated fiber rovings 131.

Figure 11:
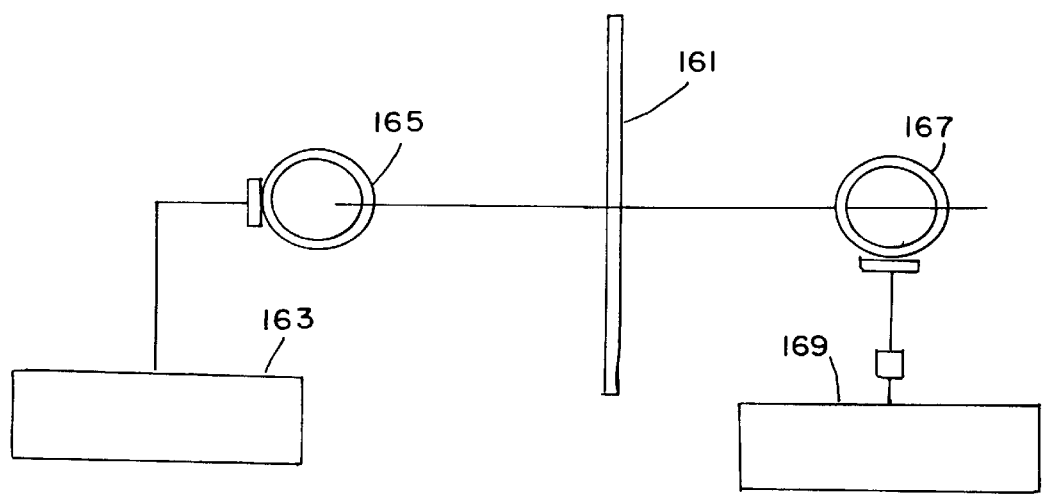
FIG. 11 is a schematic representation of testing an EMI shielding panel.

FIG. 11 is a schematic representation of an EMI shielding test panel 161 between a power generator 163 and a frequency transmitting loop antenna 165, and a receiving loop antenna 167 and a voltmeter 169. In the test the panel is about 2 inches from transmitting antenna 165 and 1¼ inches from receiving antenna 167.

Figure 12:
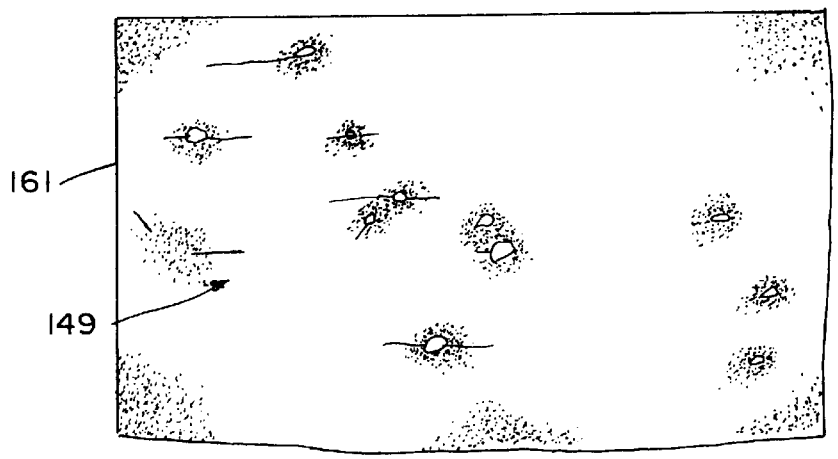
FIG. 12 is a photograph of EMI shielding material.

FIG. 12 shows an EMI shielding panel 161 with metal coated fibers 149 profused through a plastic matrix.

While the invention has been described with reference to specific embodiments, modifications and variations of the invention may be constructed without departing from the scope of the invention, which is defined in the following claims.

I claim:

1. A degradable electromagnetic interference shielding and electrostatic discharge material for electronic device housings, comprising about 85% to 95% degradable plastic and about 5% to 15% conductive additive intimately mixed with the degradable plastic for increasing strength, thermal conductivity, electromagnetic interference shielding and electrostatic discharge capabilities of the material.

2. The material of claim 1, wherein the degradable plastic is a degradable polymer.

3. The material of claim 1, wherein the degradable plastic is a degradable monomer.

4. The material of claim 1, wherein the degradable plastic is selected from a group consisting of polylactic acid, starch polycaprolactone, cellulose esters, zein, lesquerell and soybean oils.

5. The material of claim 1, wherein the electromagnetic interference shielding and electrostatic discharge material conductive additive comprises metal coated fibers.

6. The material of claim 1, wherein the electromagnetic interference shielding and electrostatic discharge material conductive additive comprises iron coated fibers.

7. The material of claim 1, wherein the electromagnetic interference shielding and electrostatic discharge material conductive additive comprises iron coated carbon fibers.

8. The material of claim 7, wherein the degradable plastic comprises about 90% by weight polylactic acid polymer, and wherein the conductive additive comprises about 10% as iron coated carbon fibers.

9. The material of claim 1, wherein the electromagnetic interference shielding and electrostatic discharge material conductive additive is selected from a group consisting of iron nickel coated carbon fibers, iron coated carbon fibers, iron-carbide coated fibers, stainless steel fibers and aluminum fibers.

10. The material of claim 1, wherein the electromagnetic interference shielding and electrostatic discharge material conductive is an intrinsic conductive polymer selected from a group of conductive polymers consisting of polyparaphenylene, polyacetylene, polyanaline, polyquinoline and polythiophene.

11. An electronic device housing material comprising degradable plastic and conductive additive intimately mixed therein for providing EMI shielding and electrostatic discharge protection.

12. The material of claim 11, wherein the degradable plastic is selected from a group consisting of polylactic acid, starch and polycaprolactone, cellulose esters, zein, modified lesquerell and soybean oils.

13. The material of claim 11, wherein the electromagnetic conductive additive comprise metal coated fibers.

14. The material of claim 11, wherein the electromagnetic interference shielding and electrostatic discharge conductive additive comprise iron coated carbon fibers.

15. The material of claim 14, wherein the degradable plastic comprises about 90% by weight polylactic acid polymer, and wherein the conductive additive comprise about 10% iron coated carbon fibers.

16. The material of claim 11, wherein the electromagnetic interference shielding and electrostatic discharge conductive additive are selected from a group consisting of iron nickel coated carbon fibers, iron coated carbon fibers, iron-carbide, stainless steel fibers and aluminum fibers.

17. The material of claim 14, wherein the electromagnetic interference shielding and electrostatic discharge protective conductive additive are intrinsic conductive polymers selected from a group of conductive polymers consisting of polyparaphenylene, polyacetylene, polyanaline, polyquinoline and polythiophene.

18. The method of making an electronic enclosure with the material of claim 1, comprising providing degradable plastic pellets, providing metal coated fibers, intimately mixing degradable plastic pellets and the metal coated fibers, and putting the degradable plastic pellets under heat and pressure with the metal coated fibers intimately mixed therein, forming the degradable plastics and metal coated fibers into electronic device enclosures, thereby providing the enclosure with electromagnetic interference shielding, electrostatic discharge protection and increased strength of the material.

19. The method of claim 18, wherein the providing of metal coated fibers further comprises unreeling a tow with plural fibers, vapor coating the fibers with metal, coating the metal coated fibers in the tow with sizing, hardening the sizing, and chopping the sizing-coated tow into sized metal coated fiber pellets, wherein the mixing comprises mixing the plastic pellets and sized metal coated fiber pellets, and wherein heating and melting the plastic pellets further comprises dissolving the sizing and intimately mixing the metal coated chopped fibers throughout the melted plastic.

20. The method of preparing the metal coated fibers of claim 18, comprising unreeling tows of fibers, passing the unreeled fiber tows into a vapor deposition chamber, vapor depositing metal coatings on the fibers, passing the tows into a sizing chamber, coating the tows with sizing, drying the sizing-coated tows, and chopping the dried tows into pellets.

21. Material of claim 1 in conductive particle pellets, comprising fibers in tows coated with vapor deposited metal, coated with sizing in the tows and chopped into pellets of sizing coated tows.

22. The conductive particle pellets of claim 21, wherein the fibers are approximately 7 microns in diameter, wherein the metal coating is about 1 micron in thickness, and wherein about 12,000 fibers are in the tows and the pellets are about ¼" by ⅛".

23. A degradable electromagnetic interference shielding and electrostatic discharge material, comprising about 85% to 95% degradable plastic and about 5% to 15% conductive additive intimately mixed with the degradable plastic for increasing strength, thermal conductivity, electromagnetic interference shielding and electrostatic discharge capabilities of the material.

* * * * *